United States Patent [19]

Deiss

[11] Patent Number: 5,381,181
[45] Date of Patent: Jan. 10, 1995

[54] CLOCK RECOVERY APPARATUS AS FOR A COMPRESSED VIDEO SIGNAL

[75] Inventor: Michael S. Deiss, Zionsville, Ind.

[73] Assignee: Thomson Consumer Electronics, Inc., Indianapolis, Ind.

[21] Appl. No.: 60,923

[22] Filed: May 13, 1993

[51] Int. Cl.[6] .............................................. H04N 7/13
[52] U.S. Cl. .................................... 348/423; 348/474; 348/500
[58] Field of Search ............... 348/500, 423, 432, 434, 348/473, 474, 476, 484; H04N 7/13

[56] References Cited

U.S. PATENT DOCUMENTS

| 4,827,339 | 2/1989 | Wada et al. | 358/136 |
| 5,052,029 | 9/1991 | James et al. | 375/107 |
| 5,287,182 | 2/1994 | Haskell et al. | 348/500 |

OTHER PUBLICATIONS

C. Declerck, "Coding of Moving Pictures and Associated Audio", Title: Proposal for Multiplex Structure in MPEG2 ISO/IEC/JTC1/SC2/WG11, MPEG 93/75, Jan. 1993.

R. Siracusa et al., "A Proposal for General MPEG Transport Syntax and Structure" ISO-IEC JTC1/SC29/WG11, MPEG 93/064, Jan. 1993.

J. C. Tiernan et al., "Description of a Universal Packet Multiplex Transport for the Transmission of Broadcast Applications of Digital Services, including Video, Audio, and Data Programs", technical proposal X3L3.1/93—006, submitted to the International Organization For standardization, 9 Jan. 1993.

*Primary Examiner*—Howard W. Britton
*Attorney, Agent, or Firm*—Joseph S. Tripoli; Eric P. Herrmann; Ronald H. Kurdyla

[57] ABSTRACT

Apparatus for developing synchronization of an intermediate layer of signal such as the transport or multiplex layer of a multi-layered compressed video signal, includes at the encoding end of the system a modulo K counter which is clocked responsive to a system clock, and the count valued is embedded in the signal at the transport layer according to a predetermined schedule. At the receiving end of the system a similar counter is responsive to a controlled receiver clock signal and the count value of this counter is sampled at the arrival of the count values embedded in the transport layer. The differences of successive sampled count values of the receiver counter are compared with the differences of corresponding successive values of the embedded count values in the transport layer to provide a signal to control the receiver clock signal.

9 Claims, 5 Drawing Sheets

FIG. 6
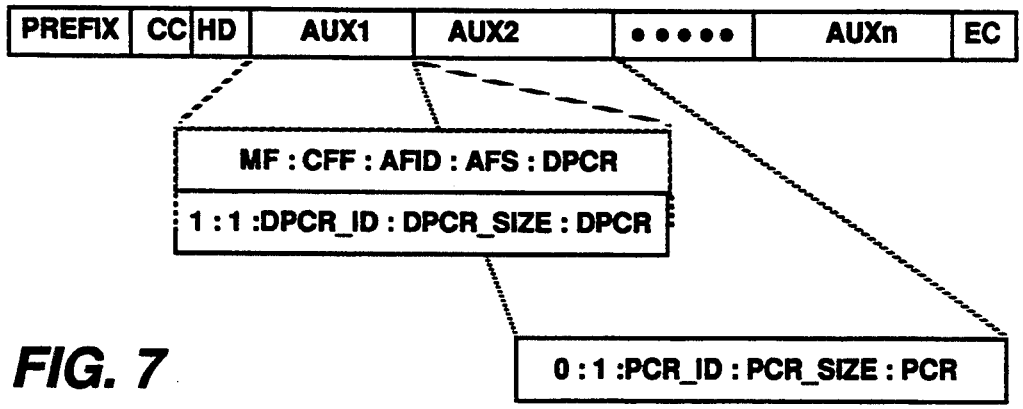
FIG. 7
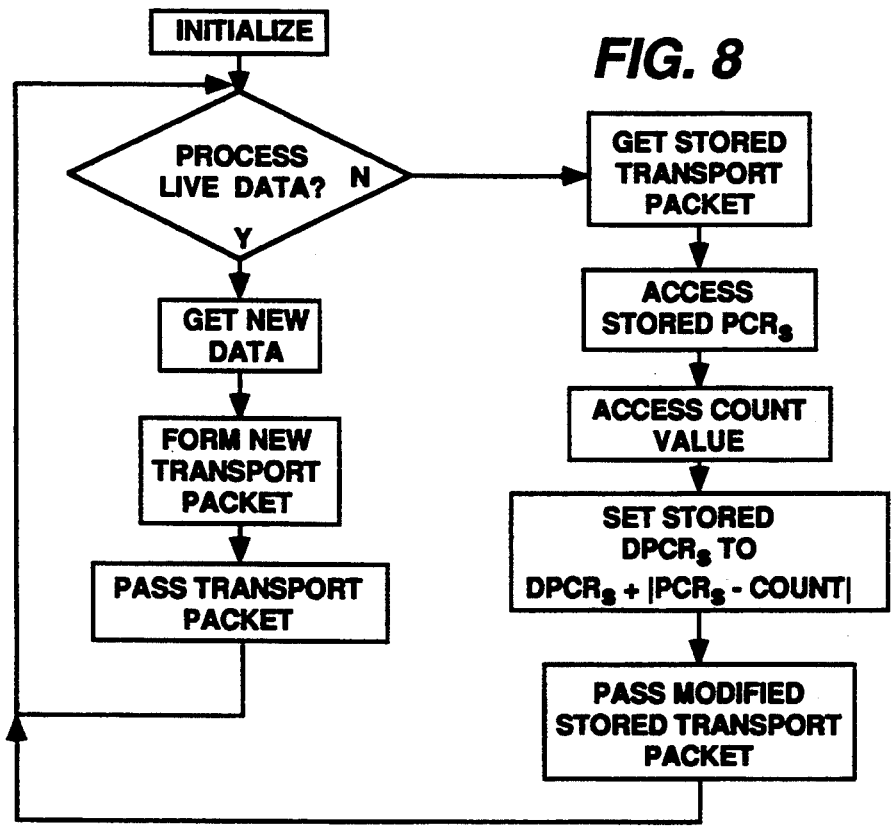
FIG. 8

CLOCK RECOVERY APPARATUS AS FOR A COMPRESSED VIDEO SIGNAL

This invention relates to a method and apparatus for providing a clock signal at a signal decompression apparatus, which clock signal is substantially frequency locked to a clock signal at a encoding apparatus.

BACKGROUND OF THE INVENTION

Compressed video signal generation and transmission systems may operate on several levels of synchronization or perhaps more properly called asynchronization. For example the actual compression apparatus will be synchronized, at least in part to the vertical frame rate of the source video signal, and it may also be synchronized to the color subcarrier. Once the video signal is compressed and formed into a particular signal protocol, such as MPEG 1, it may be further processed into transport packets for transmission. The transport packets may be time division multiplexed with packets from other video or data sources. The packetizing and multiplexing may or may not be done in a mutually synchronous fashion, which may or may not be synchronous with the compression operation. The transport packets (whether multiplexed or not) may thereafter be supplied to a modem for transmission of the data. The modem may or may not operate synchronously with the prior mentioned systems.

At the receiver of a fully multiplexed transmitted compressed signal, it is usually necessary that the various subsystems operate synchronously with their inverse function counterpart elements at the encoding end of the system. Synchronous operation in this case, in general, may mean that the respective subsystems operate extremely close to the same frequencies as their counterpart subsystems. For example, the decompressor should provide video signal at the same frame rate as provided by the video signal source at the compressor, and synchronized with associated audio. Synchronization of the video/audio decompression portion of the system may be accomplished by inserting, at the encoder, presentation time stamps within the compressed video/audio signals, that indicate the relative times of production/reproduction of respective segments of signal. Such presentation time references, PTR's, may be used to compare the timing of associated audio and video signals for synchronization purposes and for proper sequencing and continuity.

The receiver modem must of course operate at the precise frequency as the transmitting modem. Receiver modems typically include phase locked loops responsive to the transmitted carrier frequencies or eye patterns for generating synchronous clock signals.

Synchronization of the multiplexing and or transport packetizing apparatus tends to be somewhat more complicated for two reasons. The first is that multiplexed data may be arriving sporadically. The second is that rate buffering is usually employed between the modem and the decompressor, and provision must be made to insure that the rate buffer neither overflows nor underflows with the constraint that the buffer be kept as small as practical to minimize manufacturing cost.

SUMMARY OF THE INVENTION

The present invention is apparatus for developing synchronization of an intermediate layer of signal such as the transport or multiplex layer of a multi-layered compressed video signal. At the encoding end of the system a modulo K counter is clocked responsive to a system clock, and the count valued is embedded in the signal at the transport layer according to a predetermined schedule. At the receiving end of the system a similar counter is responsive to a controlled receiver clock signal and the count value of this counter is sampled at the arrival of the count values embedded in the transport layer. The differences of successive sampled count values of the receiver counter are compared with the differences of corresponding successive values of the embedded count values in the transport layer to provide a signal to control the receiver clock signal.

BRIEF DESCRIPTION OF THE DRAWINGS

FIGS. 6 and 7 are pictorial diagrams of a transport block and an auxiliary signal transport block.

FIG. 8 is a flow chart of the operation of the transport processor of FIG. 2.

DETAILED DESCRIPTION

Figure 1:
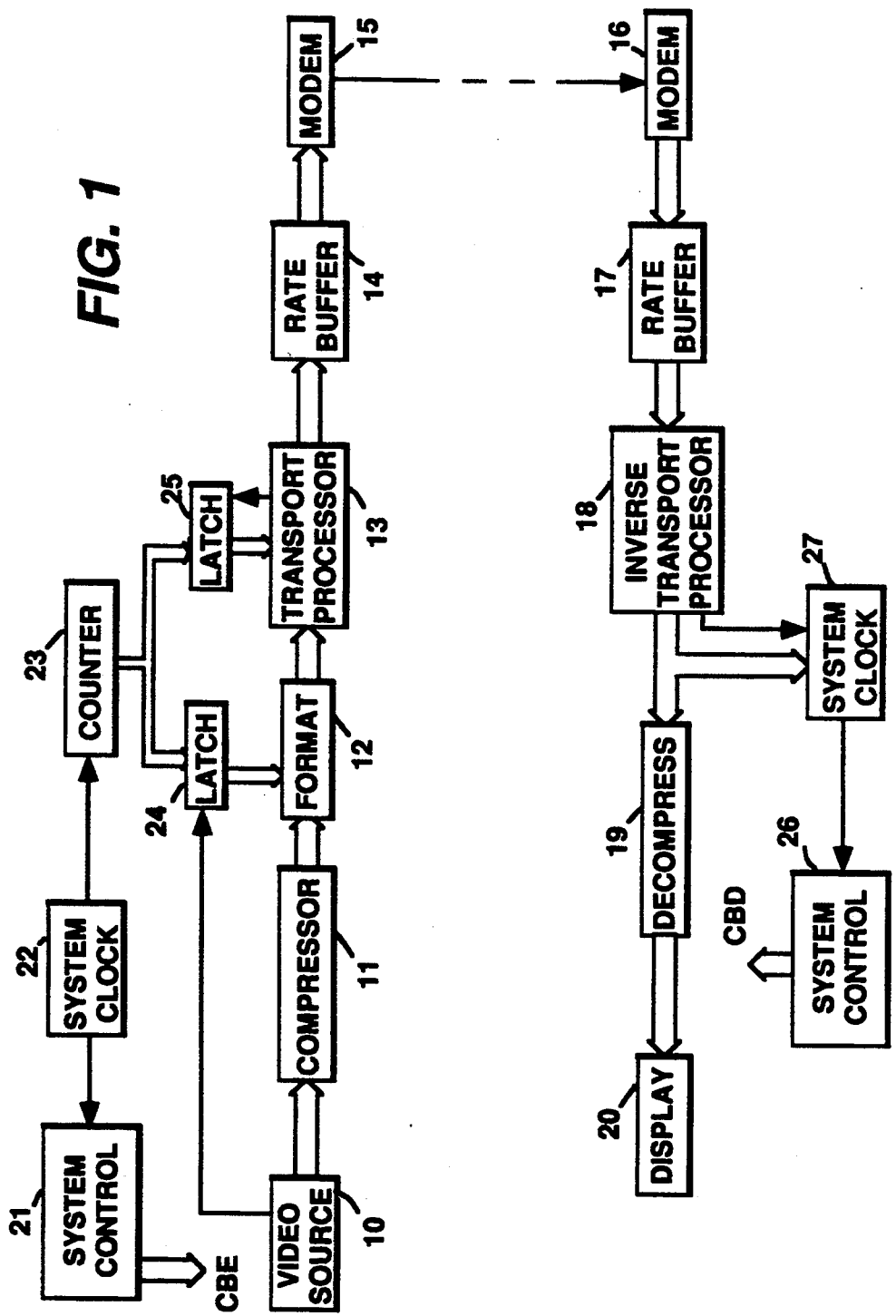
FIG. 1 is a block diagram of a compressed video encoding/decoding system incorporating clock recovery apparatus embodying the present invention.

FIG. 1 illustrates a typical system in which the invention may be practiced, which system is a compressed digital video signal transmission arrangement. In this system, video signal from a source 10 is applied to a compression element 11 which may include a motion compensated predictive encoder utilizing discrete cosine transforms. Compressed video signal from the element 11 is coupled to a formatter 12. The formatter arranges the compressed video signal and other ancillary data according to some signal protocol such as MPEG, a standard developed by the International Organization for Standardization (Organisation Internationale De Normalisation). The standardized signal is applied to a transport processor 13, which divides the signal into packets of data and adds certain overhead to provide some noise immunity for the transmission purposes. The transport packets, which normally occur at a non-uniform rate are applied to a rate buffer 14 which provides output data at a relatively constant rate conducive to efficient use of a relatively narrow bandwidth transmission channel. The buffered data is coupled to a modem 15 which performs the signal transmission.

A system clock 22 provides clocking signal to operate much of the apparatus, at least including the transport processor. This clock will operate at a fixed frequency such as 27 MHz for example. As shown herein, however, it is used to generate timing information. The system clock is coupled to the clock input of a counter 23 which may be arranged to count modulo $2^{30}$, for example. The count values output by the counter are applied to two latches 24 and 25. The latch 24 is conditioned by the video source to latch count values on the occurrence of respective frame intervals. These count values are denoted presentation time stamps, PTR's, and are included in the compressed video signal stream by the formatter 12, and are used by the receiver to provide lip-synchronization of associated audio and video information. The latch 25 is conditioned by the transport processor 13 (or the system controller 21) to latch count values according to a predetermined schedule. These count values are denoted program clock references, PCR's, and are embedded as auxiliary data within respective auxiliary transport packets.

The system controller 21 is a variable state machine programmed to coordinate the various processing elements. Note that the controller 21, the compressor 11 and the transport processor 13, may or may not operate synchronously via a common clocking arrangement as long as proper handshaking is provided between processing elements.

Elements 16–26 of FIG. 1 comprise a receiving end of the transmission system wherein the modem 16 performs the inverse function of the modem 15 and the rate buffer 17 performs, in effect, the inverse function of the rate buffer 14. Data from the rate buffer 17 is applied to an inverse transport processor 18, which provides compressed video signal according to the system protocol to the decompressor 19. The decompressor, responsive to the compressed video signal generates non-compressed video signal for display on the device 20, or for storage etc., in an appropriate device.

The inverse processor 18 also provides PCR's from the auxiliary transport data, and control signals to a system clock generator 27. The clock generator responsive to these signals generates a system clock signal synchronous with at least the transport processor operation. This system clock signal is applied to the receiver system controller 26 to control the timing of appropriate processing elements.

Figure 2:
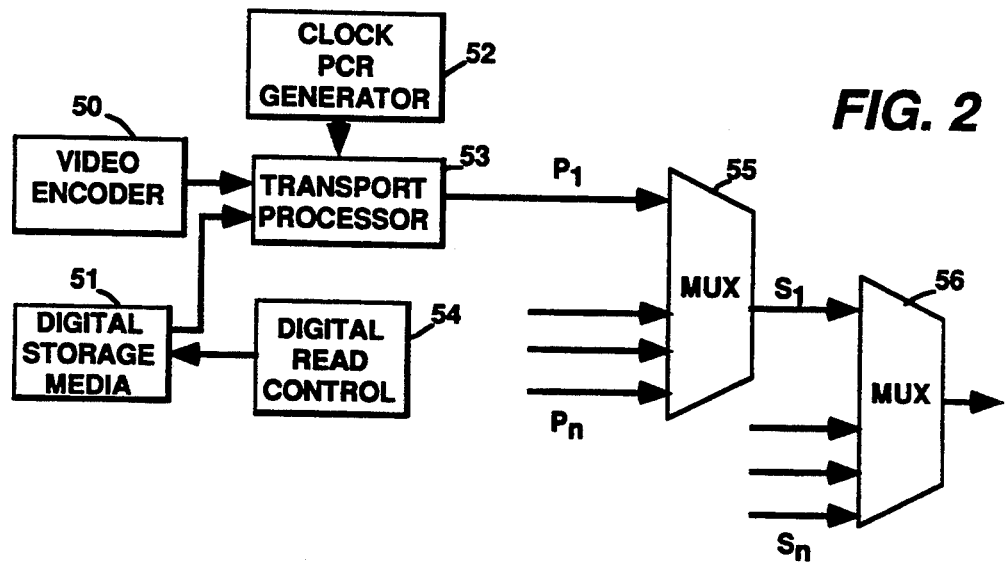
FIG. 2 is a block diagram of signal multiplexing apparatus useful in representing the development of multiplexed data from different sources.

Refer to FIG. 2 which illustrates apparatus which may be included in the transmission modem 15 for example. The modem may receive data from a plurality of sources, which data is all to be transmitted on a common transmission channel. This may be accomplished by time division multiplexing of the various signals from the various sources. In addition the multiplexing may be layered. For example video programs, $P_i$, may be generated in different studios, and coupled to a first multiplexer 55. These programs are time division multiplexed according to known techniques and provided as a source signal $S_1$.

The signal $S_1$, and other source signals $S_i$, from other sources are applied to a second layer multiplexer 56, wherein the signals $S_i$ are time division multiplexed according to known techniques and predetermined scheduling. Finally, within the respective programs themselves, there may be a further form of multiplexing. This multiplexing may take the form of commercials inserted into program material or of stored material inserted between segments of live production material. In these latter cases it is presumed that the commercials or stored material has been pre-encoded with respective PTR's and PCR's. In this instance the PTR's and PCR's of the stored material will be unrelated to the real time PTR's and PCR's of the live material. Regarding the PTR's, this will typically not create problems because the video signal will include parameters instructing the decompressor to re-initialize to new signal. Conversely the lack of correlation between the stored and real time PCR's may totally disrupt the rate buffer-inverse transport processor elements of a receiver system do to loss of synchronization.

In FIG. 2 it is assumed that the transport processor 53 includes a multiplexing apparatus similar in operation to the distinct multiplexers 55 and 56.

A further problem exists within a multiplexed system. In order not to lose data at respective multiplexing sites if data concurrently arrives from a plurality of sources, it is necessary to provide a degree of signal buffering within the multiplexers. These buffers will impose a delay T±δt, where δt represents a jitter component. Assume a program transits 100 multiplexers (an exaggerated number to accentuate the problem), and each multiplexing adds 1 sec.±1 μsec. of delay. The end to end delay is 100 sec.±100 μsec. of delay. The 100 seconds of delay is of little consequence to the decompressor because the compressed video and thus the PTR's have undergone the same delay. The ±100 μsec. of jitter must be accommodated or else the decoder buffer may overflow or underflow.

Figure 3:
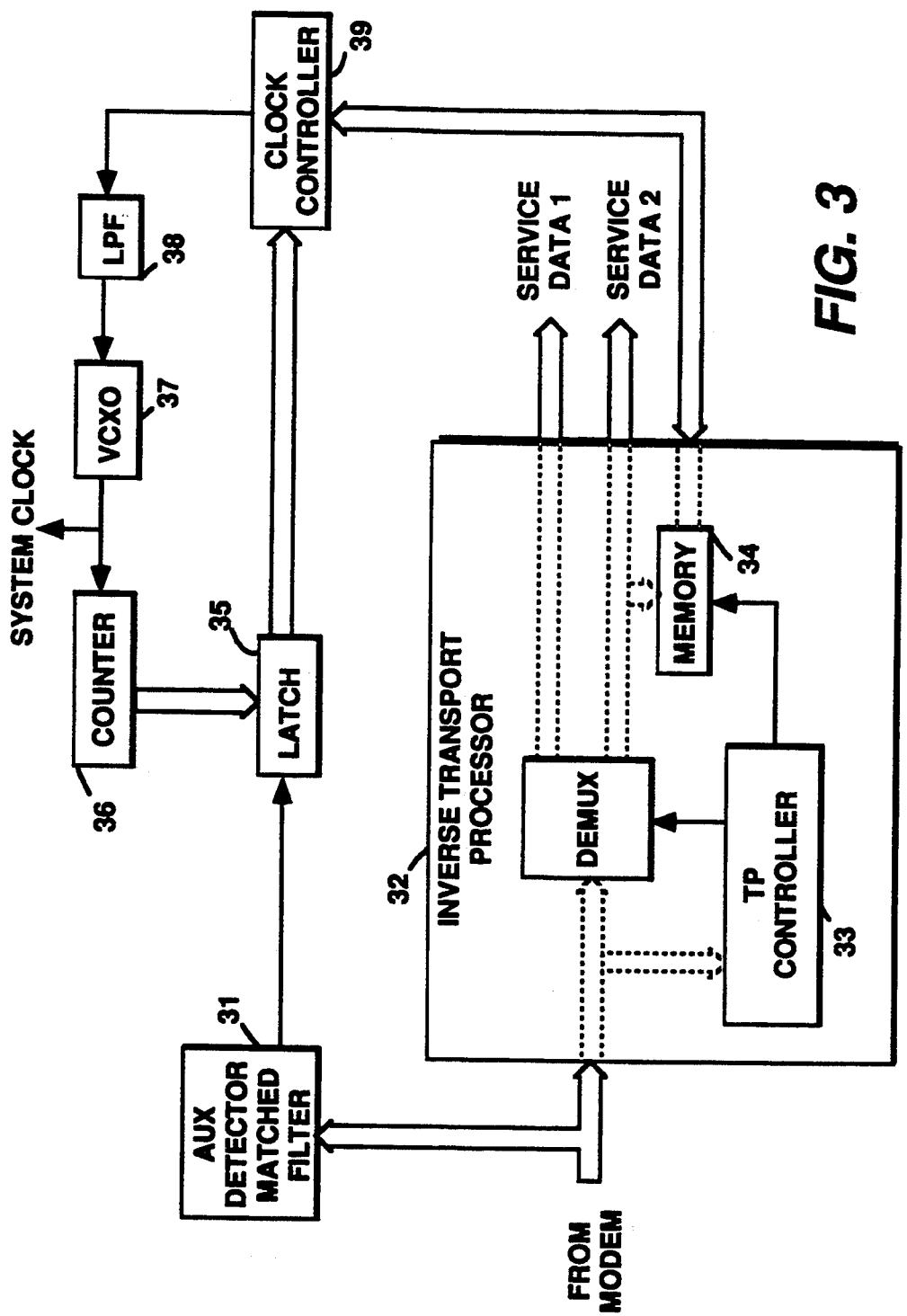
FIGS. 3 and 5 are block diagrams of alternative embodiments of clock recovery apparatus for use with transmitted compressed video data.

FIG. 3 illustrates a first embodiment of a receiver clock regenerator. In this embodiment, the transport processor may be located ahead of the rate buffer 17, in the signal path, to eliminate variable delays which may be incurred in the receiver rate buffer. Data from the receiver modem is coupled to an inverse transport processor 32, and an auxiliary packet detector 31. The inverse transport processor 32 separates transport header data from the respective transport packet payloads. Responsive to the transport header data, the processor 32 applies video signal payloads (designated here as service data 1) to, for example, decompression apparatus (not shown), and auxiliary data (designated as service data 2) to the appropriate auxiliary data processing elements (not shown). The PCR's residing within the auxiliary data are routed and stored in a memory element, 34.

The auxiliary packet detector 31, which may be a matched filter arranged to recognize the codewords designating an auxiliary transport packet containing a PCR, produces a control pulse on the occurrence of transport packets containing such data. The control pulse is utilized to store within a latch 35, the count value currently exhibited by the local counter 36. The local counter 36 is arranged to count pulses provided by a e.g., voltage controlled oscillator 37. The counter 36 is arranged to count modulo the same number as its counterpart counter in the encoder (counter 23).

The voltage controlled oscillator 37 is controlled by a low pass filtered error signal provided by a clock controller 39. The error signal is generated in the following fashion. Let the PCR arriving at time n be designated $PCR_n$ and the count value concurrently latched in latch 35 be designated $L_n$. The clock controller reads the successive values of PCR's and L's and forms an error signal E proportional to the differences $$E \to |PCR_n - PCR_{n-1}| - |L_n - L_{n-1}|$$

The error signal E, is utilized to condition the voltage controlled oscillator 37 to a frequency tending to equalize the differences. The error signal produced by the clock controller 39 may be in the form of a pulse width modulated signal, which may be rendered to an analog error signal by implementing the low pass filter 38 in analog components.

The constraints on this system are that the counters at the two ends of the system count the same frequency or even multiples thereof. This requires that the nominal frequency of the voltage controlled oscillator be fairly close to the frequency of the frequency of the system clock of the encoder.

The foregoing approach provides rather rapid synchronization but may introduce a long term error. Long term error LTE is proportional to the difference $$LTE \rightarrow |L_n - L_0| - |PCR_n - PCR_0|$$

where $PCR_0$ and $L_0$ are for example the first occurring PCR and the corresponding latched value of the receiver counter. Nominally the error signals E and LTE will vary in discrete steps. As such, once the system is "synchronized" the error signal will dither one unit about the null point. The preferred method of synchronization is to initiate control of the voltage controlled oscillator using the error signal E until a one unit dither occurs in the error signal E, and then to switch to the use of the long term error signal LTE to control the voltage controlled oscillator.

In order to accommodate the delays, $T \pm \delta t$, incurred in the multiplexing process, the transport processor at the encoder creates an auxiliary field within an auxiliary transport packet which contains information relating to variable delays. Provision is made for modifying this variable delay information at respective multiplexing locations. Refer to FIGS. 6 and 7. FIG. 6 illustrates pictorially a transport packet of the type used in the High Definition Television System developed by the Advanced Television Research Consortium. This transport packet includes a prefix which contains, among other things, a general identifier to indicate to which service the payload contained within the packet is related. The field CC is a continuity check value included for error check purposes. The HD field is a service specific header which specifically defines the payload. For example, if the particular service is designated to provide television programming, respective payloads of the transport packets of that service type may include audio data, video data, or related auxiliary data. The HD field thus indicates the particular payload type for the particular packet.

FIG. 7 illustrates a transport packet which includes auxiliary data. The payload of an auxiliary transport packet may include one or more auxiliary groups, depending on the amount of data included in respective groups and the current system requirements. In the transport packet illustrated in FIG. 7 there are two auxiliary groups containing data related to the program clock reference, AUX1 and AUX2. The auxiliary group AUX1 includes data related to variable delays and the group AUX2 includes the PCR per sé. The respective groups include an auxiliary group prefix and an auxiliary data block. The prefix includes the fields MF, CFF, AFID, and AFS. The field MF is a 1-bit field which indicates whether the data in the packet is modifiable (1 if modifiable 0 if not). CFF is a 1-bit field which indicates whether auxiliary data is defined for this group. AFID is a 6-bit field which identifies the type of auxiliary data contained in the group, e.g., time code, scramble key, copyright, etc. AFS is an 8-bit field defining the number of bytes of auxiliary data contained in the group.

The AUX1 group is shown as being modifiable and the AUX2 group is shown as not being modifiable. AUX2 data is shown to be PCR data i.e. the program clock reference. The AUX1 data is indicated as DPCR data which is an acronym herein for differential program clock reference. The PCR data is captured under control of a scheduler which controls the transport processor in the encoder. DPCR data is captured as will be described with reference to FIG. 4.

Figure 4:
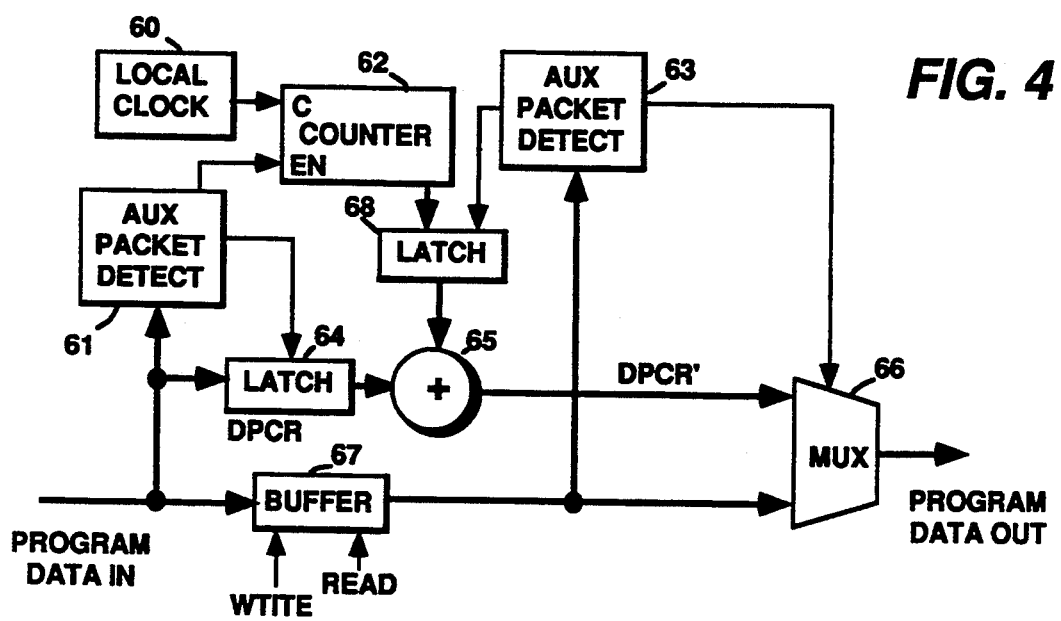
FIG. 4 is a block diagram of signal multiplexing apparatus including a system for augmenting timing references included within the multiplexed signal.

The FIG. 4 apparatus is exemplary apparatus of a portion of one of the multiplexer circuits shown in FIG. 2. Associated with respective input busses is a buffer store 67 which may be a FIFO. Data is stored therein when program data arrives and the multiplexor is currently accessing a different input bus. Thereafter, according to the scheduling of the multiplexer, the program data is read from the buffer store 67.

Respective transport packets of the program data include auxiliary groups containing PCR and DPCR data. Note that the value of the PCR data is determined relative to the timing of the transport packet containing the auxiliary timing information. This PCR data, when output by the multiplexer, may be in error by virtue of any delays incurred in multiplexing contention. The delay time $T \pm \delta t$ taken to transit the buffer store is used to modify the DPCR data to subsequently correct such errors. An auxiliary packet detector, 61, arranged to detect the occurrence of transport packets containing DPCR data, is coupled to the program data input bus. This detector functions to reset and enable a counter 62 to count pulses of a local clock 60. The local clock 60 may be a crystal oscillator having a frequency which is very close to the encoder system clock frequency, or it may be frequency locked to the encoder clock as per the operation of the FIG. 3 or 5 apparatus. A further auxiliary packet detector 63 is coupled to the output bus of the buffer store 67, and is arranged to store current count value output the counter 62 in the latch 68 when the auxiliary packet containing the DPCR data emerges from the buffer. At this time the output of the counter will exhibit a count value, in units of cycles of the clock frequency, of the transit time through the buffer of the particular packet. Note, if a plurality of auxiliary packets are likely to occur in close proximity, such that more than one may be concurrently transiting the buffer 67, the auxiliary packet detectors must be arranged to detect and respond to the first occurring packet.

The auxiliary packet detector 61 also provides a control signal which is applied to condition a latch 64 to store the DPCR value contained within the auxiliary packet. This value is applied to one input port of an adder 65. The local count value stored in the latch 68 is applied to the second input port of the adder 65. The adder 65 sums the DPCR data from the current auxiliary packet with the local count value to provide an updated DPCR value DPCR'. The program data from the buffer 67 and the output of the adder 65 are coupled to respective input ports of a 2-to-1 multiplexer 66. The multiplexer 66 is conditioned by the auxiliary packet detector 63 to normally pass the program data. However when the DPCR data contained in the program data emerges from the buffer, the multiplexer 66 is conditioned to pass the updated DPCR' data from the adder, and then switch back to passing data from the buffer 67.

When the multiplexer 66 is conditioned to pass data from the adder, the output signal from the adder corresponds to the sum of the DPCR data contained in the auxiliary packet plus the count value in the counter 62 when the DPCR data emerges from the buffer. The data substituted for the DPCR data by the multiplexer 66 is thus the prior DPCR data corrected for its transit time in the buffer 67. Note, it is recommended that the auxiliary packet detector be programmed to only change program data in accordance with the appropriate modifier flags, MF, of the auxiliary groups.

Referring back to FIG. 2, the transport processor 53 will establish the DPCR auxiliary groups and normally insert a zero value for the DPCR data corresponding to new programs. Recall however, that stored data from the digital storage media 51 may be inserted between segments of live data, and that the stored data may be pre-encoded with PCR and DPCR codes. When the transport processor 53 is to insert stored data between segments of live data, it accesses the PCR code of the stored data and subtracts this PCR value from the count value currently exhibited by the counter 23 and/or latch 25. The transport processor then adds this difference to the DPCR value in the auxiliary packets of the stored data. The new DPCR values in the stored data inserted between live data now contains a reference to current time. This process is illustrated in the flow chart of FIG. 8, which is self explanatory.

Figure 5:
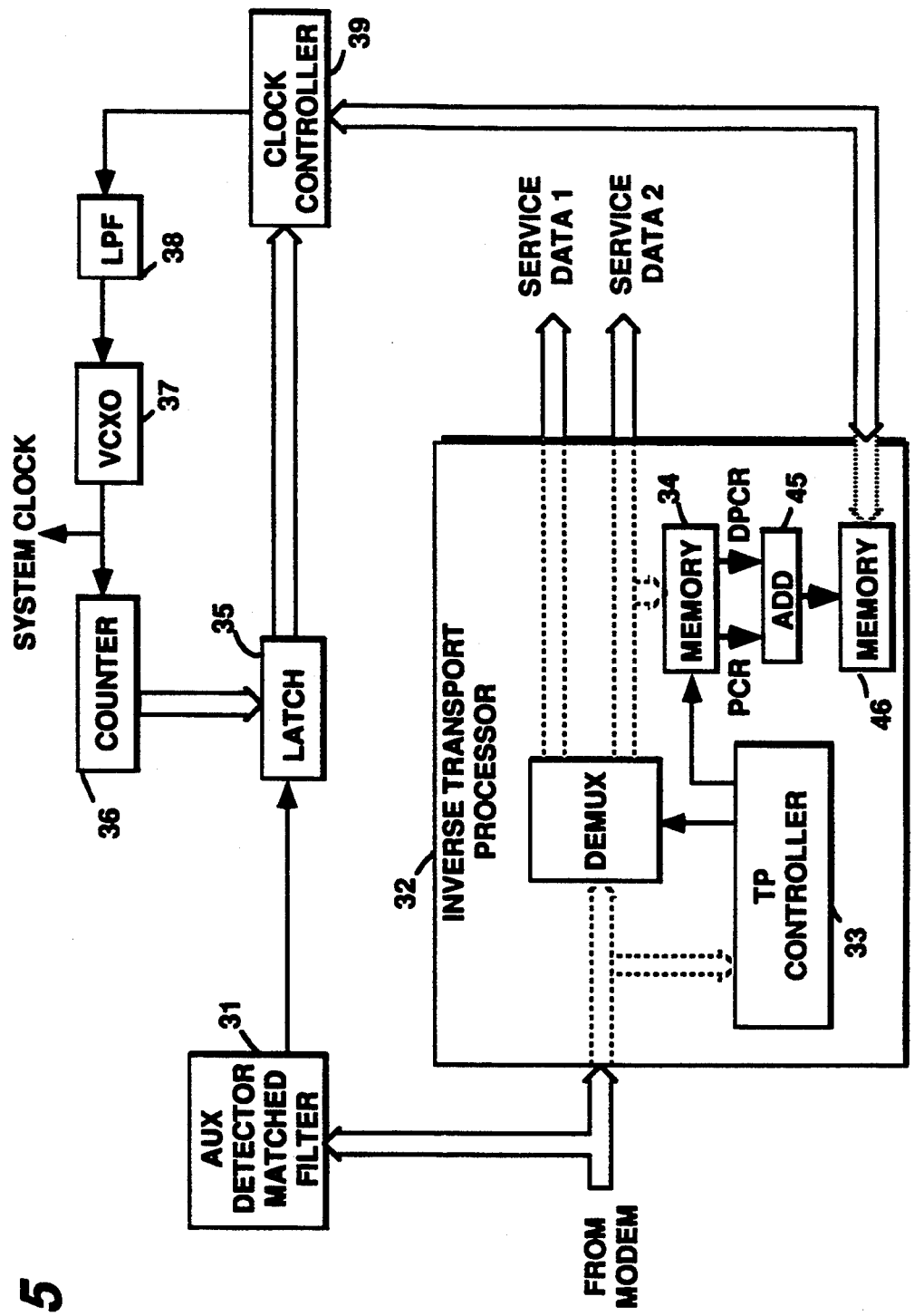

The use of the DPCR data in a receiver is illustrated in FIG. 5. In FIG. 5 elements designated with the same numerals as elements in FIG. 3 are similar and perform similar functions, except that the function of element 32 has been modified. The modification involves including adder 45 arranged to sum the corresponding PCR and DPCR values arriving in associated auxiliary groups. The sums provided by the adder correspond to the original PCR value augmented by any transit delays incurred in multiplexing for example. The sums are placed in memory 46 where they are available to the clock controller 39 as corrected PCR' values for system clock synchronization.

What is claimed is:

1. Apparatus for providing a compressed video signal, including a plurality of signal components, comprising:
   a source of video signal;
   compression means coupled to said source for providing compressed video data including descriptive headers and data representing pixel information;
   a system clock for providing clock pulses;
   a counter for counting said clock pulses modulo M, where M is a value greater than $2^{10}$;
   means for periodically storing, in synchronism with a component of said video signal, count values (PTR's) provided by said counter;
   means for formatting said compressed video data and stored count values to form a compressed video signal according to a predetermined protocol;
   further means for periodically storing, further count values (PCR's) provided by said counter, independently of said signal components, which further count values are normally different from said count values (PTR's);
   a transport processor coupled to receive formatted compressed video data, for dividing said compressed video data into transport packet payloads of predetermined amounts of video data, and for forming transport headers, said transport processor concatenating said transport packet payloads, including said PTR's, with respective transport headers, to form respective transport packets, said transport processor also forming further transport packets of information including payloads of at least said further count values (PCR's), and interspersing said further transport packets with compressed video signal transport packets; and
   means for conveying said compressed video signal transport packets interspersed with said further transport packets.

2. Apparatus for synchronizing, at least a portion of a compressed video signal receiving system which processes a compressed video signal occurring in transport packets of compressed video signal interspersed with transport packets which include count values (PCR's) periodically obtained asynchronously with said video signal, from a counter arranged to count modulo M, (M greater than $2^{10}$) pulses of an encoding system clock, said apparatus comprising:
   a source of transport packets including compressed video transport packets and transport packets which include said count values (PCR's);
   a controlled oscillator, responsive to a control signal, for providing a receiver system clock;
   a receiver counter arranged to count pulses of said receiver system clock modulo M;
   means, responsive to the occurrence of transport packets which include said count values, for storing count values output by said receiver counter; and
   means responsive to the differences of count values in successively occurring transport packets which include said count values, and differences in corresponding successively stored count values output by said receiver counter for generating a control signal, E, for controlling said controlled oscillator.

3. The apparatus set forth in claim 2 wherein said means for generating said control signal, E, includes means for calculating said control signal, E, proportional to:

$$E = f(|PCR_n - PCR_{n-1}| - |RCV_n - RCV_{n-1}|)$$

where $PCR_n$ and $PCR_{n-1}$ are successive count values occurring in transport packets and $RCV_n$ and $RCV_{n-1}$ are corresponding stored count values output by said receiver clock.

4. Apparatus for synchronizing at least a portion of a compressed video signal receiving system which processes a compressed video signal occurring in transport packets of compressed video signal interspersed with transport packets which include count values (PCR's) periodically obtained asynchronously with said video signal, from a counter arranged to count modulo M, (M greater than $2^{10}$) pulses of an encoding system clock, said apparatus comprising;
   a source of transport packets including compressed video transport packets and transport packets which include said count values (PCR's);
   a controlled oscillator, responsive to a control signal, for providing a receiver system clock;
   a receiver counter arranged to count pulses of said receiver system clock modulo M;
   means, responsive to the occurrence of transport packets which include said count values, for storing count values output by said receiver counter;
   means responsive to the differences of count values in successively occurring transport packets which include said count values, and differences in corresponding successively stored count values output by said receiver counter for generating a control signal, E, for controlling said controlled oscillator;
   means for storing count values $PCR_0$ and $RCV_0$ which correspond to a count value occurring in a transport packet occurring at system start up and a corresponding receiver count value respectively;

means for calculating a control signal, E', proportional to:

$$E' = f(|PCR_n - PCR_0| - |RCV_n - RCV_0|)$$

where $PCR_n$ is a count value occurring in current transport packet and $RCV_n$ is a corresponding stored count value output by said receiver clock; and means for selectively providing said signals E or E' as control signals for controlling said controlled oscillator.

5. Apparatus for providing a compressed signal including a plurality of components, comprising:

a source of said signal including a plurality of components;

compression means coupled to said source for providing compressed signal components including descriptive headers and data representing pixel information formatted according to a predetermined protocol;

a system clock for providing clock pulses;

a counter for counting said clock pulses modulo M, where M is a value greater than $2^{10}$;

means for periodically storing count values (PCR's) provided by said counter which are asynchronous with and independent of said plurality of signal components;

a transport processor coupled to receive formatted compressed, for dividing said compressed signal into segments of predetermined amounts of data, and for forming transport headers, said transport processor concatenating respective transport headers with payloads consisting of respective segments of said compressed signal to form respective transport packets, said transport processor also including means for forming auxiliary transport packets, distinguishable from said transport packets, and including at least said count values, and interspersing said auxiliary transport packets with compressed signal transport packets; and means for conveying said compressed video signal transport packets interspersed with said auxiliary transport packets.

6. The apparatus set forth in claim 5 wherein said transport processor includes means for determining instances at which said count values are to be stored.

7. Video signal compression apparatus comprising:

a source of video signal;

a source of a clock signal;

a counter for counting said clock signal modulo N, where N is an integer greater than $2^5$;

means for capturing count values provided by said counter as Presentation Time references, which Presentation Time references are synchronized with predetermined segments of said video signal;

Compression means for compressing said video signal and hierarchically formatting compressed video data with said Presentation Time references included;

means for periodically selecting, asynchronously with said video signal, further count values provided by said counter as Program Clock References;

a transport processor coupled to receive formatted compressed video data including said Presentation Time references from said compression means, or segmenting said compressed video data into transport packets including payloads of said compressed video data and Presentation Time references concatenated with transport headers, and wherein said Program Clock References are included in payloads of ones of said transport packets; and means for conditioning said transport packets for transmission.

8. The apparatus set forth in claim 7 wherein said transport processor includes means for determining instances when said Program Clock Reference are to be selected by said means for periodically selecting further count values.

9. The apparatus set forth in claim 7 wherein said transport processor forms transport packets of compressed video data and auxiliary transport packets, which are distinguishable from said transport packets, and which include said Program Clock References, and includes means for interspersing said auxiliary transport packets with transport packets of compressed video data.

* * * * *